United States Patent
Geusic (10) Patent No.: US 6,423,613 B1
(45) Date of Patent: Jul. 23, 2002

(54) LOW TEMPERATURE SILICON WAFER BOND PROCESS WITH BULK MATERIAL BOND STRENGTH

(75) Inventor: Joseph E. Geusic, Berkeley Heights, NJ (US)

(73) Assignee: Micron Technology, Inc., Boise, ID (US)

( * ) Notice: Subject to any disclaimer, the term of this patent is extended or adjusted under 35 U.S.C. 154(b) by 131 days.

(21) Appl. No.: 09/189,276

(22) Filed: Nov. 10, 1998

(51) Int. Cl.[7] .......................... H01L 21/30; H01L 21/46
(52) U.S. Cl. ........................ 438/455; 438/799
(58) Field of Search .................. 438/455, 799, 438/456, 457, 458, 459, 798

(56) References Cited

U.S. PATENT DOCUMENTS

| | | | |
|---|---|---|---|
| 3,407,479 A | 10/1968 | Fordemwalt et al. | 29/577 |
| 3,457,123 A | 7/1969 | Van Pul | 148/1.5 |
| 3,471,754 A | 10/1969 | Hoshi et al. | 317/235 |
| 3,689,357 A | 9/1972 | Jordan | 161/119 |
| 4,051,354 A | 9/1977 | Choate | 235/312 |
| 4,292,093 A * | 9/1981 | Ownby et al. | 134/1.3 |
| 4,305,640 A * | 12/1981 | Cullis et al. | 219/121.6 |
| 4,604,162 A | 8/1986 | Sobczak et al. | 156/657 |
| 4,663,831 A | 5/1987 | Birrittella et al. | 29/576 E |
| 4,673,962 A | 6/1987 | Chatterjee et al. | 357/23.6 |
| 4,761,768 A | 8/1988 | Turner et al. | 365/201 |
| 4,766,569 A | 8/1988 | Turner et al. | 365/185 |
| 4,920,396 A * | 4/1990 | Shinohara et al. | 257/376 |
| 4,948,937 A * | 8/1990 | Blank et al. | 219/121.6 |
| 4,962,879 A * | 10/1990 | Goesele et al. | 438/455 |

(List continued on next page.)

FOREIGN PATENT DOCUMENTS

| | | | |
|---|---|---|---|
| JP | 7-320996 A | * 12/1995 | |
| JP | 09-293845 | 9/1997 | H01L/27/12 |

OTHER PUBLICATIONS

Gosele et al., "Self–propagating room–temperature silicon wafer bonding in ultrahigh vacuum", App. Phys. Lett. 67(24), 11 Dec. 1995, American Institute of Physics, pp. 3614 to 3616.*

Hayashi et al., Fabrication of Low–temperature Bottom–Gate poly–Si TFTs on Large–Area Substrate by Linear–Beam Excimer Laser Crystallization and Ion Doping Method, IEDM, 1995, pp. 829 to 832.*

J. Ramm et al., "Hydrogen cleaning of silicon wafers, Investigation of the wafer surface after plasma treatmen", Thin Solid Films, 228 (1993), pp. 23–26.*

M. Shimbo et al., "Silicon–to–silicon direct bonding method", J. Appl. Phys. 60 (8), Oct. 1986, pp. 2987–2989.*

Bengtsson & Engstrom, "Interface charge control of directly bonded silicon structures", J. Appl. Phys. 66 (3), Aug. 1989, pp. 1231–1239.*

Hayashi et al. "Fabrication of Low–Temperature Bottom–Gate Poly–Si TFTs on Large Area Substrate by Excimer–Beam Laser Crystallization and Ion Doping Method", IEEE IEDM 95, pp. 829–832, 1995.*

Goesele et al., "Self–propagating room–temperature silicon wafer bonding in ultrahigh vacuum", Appl. Phys. Lett. 67 (24), Dec. 1995, pp. 3614 to 3616.*

Zucker et al., "Application of Oxygen Plasma Processing to Silicon Direct Bonding", May 1993, Sensors and Actuators A, vol. 36, pp. 227–231.*

(List continued on next page.)

Primary Examiner—Michael J. Sherry
Assistant Examiner—Evan Pert
(74) Attorney, Agent, or Firm—Schwegman, Lundberg, Woessner & Kluth, P.A.

(57) ABSTRACT

The present invention includes a method for bonding one semiconductor surface to a second semiconductor surface. The method includes providing a first article that has a semiconductor surface and a second article that has a semiconductor surface. The semiconductor surfaces are annealed with an energy source wherein energy is confined to the semiconductor surfaces. The annealed surfaces are bonded to each other.

26 Claims, 6 Drawing Sheets

U.S. PATENT DOCUMENTS

| | | | |
|---|---|---|---|
| 4,987,089 A | 1/1991 | Roberts | 438/202 |
| 5,001,526 A | 3/1991 | Gotou | 357/23.6 |
| 5,017,504 A | 5/1991 | Nishimura et al. | 438/269 |
| 5,021,355 A | 6/1991 | Dhong et al. | 438/270 |
| 5,028,977 A | 7/1991 | Kenneth et al. | 357/43 |
| 5,097,291 A * | 3/1992 | Suzuki | 355/69 |
| 5,102,817 A | 4/1992 | Chatterjee et al. | 438/242 |
| 5,110,752 A | 5/1992 | Lu | 438/398 |
| 5,156,987 A | 10/1992 | Sandhu et al. | 438/153 |
| 5,177,028 A | 1/1993 | Manning | 438/289 |
| 5,202,278 A | 4/1993 | Mathews et al. | 438/398 |
| 5,208,657 A | 5/1993 | Chatterjee et al. | 257/302 |
| 5,223,081 A | 6/1993 | Doan | 156/628 |
| 5,234,535 A | 8/1993 | Beyer et al. | 156/630 |
| 5,266,514 A | 11/1993 | Tuan et al. | 438/398 |
| 5,320,880 A | 6/1994 | Sandhu et al. | 427/578 |
| 5,327,380 A | 7/1994 | Kersh, III et al. | 365/195 |
| 5,376,575 A | 12/1994 | Kim et al. | 438/239 |
| 5,391,911 A | 2/1995 | Beyer et al. | 257/522 |
| 5,392,245 A | 2/1995 | Manning | 365/200 |
| 5,393,704 A | 2/1995 | Huang et al. | 438/305 |
| 5,396,093 A | 3/1995 | Lu | 257/306 |
| 5,410,169 A | 4/1995 | Yamamoto et al. | 257/301 |
| 5,414,287 A | 5/1995 | Hong | 257/316 |
| 5,416,041 A | 5/1995 | Schwalke | 438/404 |
| 5,421,953 A * | 6/1995 | Nagakubo et al. | 216/34 |
| 5,422,499 A | 6/1995 | Manning | 257/7 |
| 5,438,009 A | 8/1995 | Yang et al. | 437/52 |
| 5,440,158 A | 8/1995 | Sung-Mu | 257/314 |
| 5,441,591 A | 8/1995 | Imthurn et al. | 156/153 |
| 5,445,986 A | 8/1995 | Hirota | 438/398 |
| 5,455,445 A * | 10/1995 | Kurtz et al. | 257/419 |
| 5,460,316 A | 10/1995 | Hefele | 228/39 |
| 5,460,988 A | 10/1995 | Hong | 438/259 |
| 5,466,625 A | 11/1995 | Hsieh et al. | 438/155 |
| 5,483,094 A | 1/1996 | Sharma et al. | 257/316 |
| 5,483,487 A | 1/1996 | Sung-Mu | 365/185.33 |
| 5,492,853 A | 2/1996 | Jeng et al. | 438/666 |
| 5,495,441 A | 2/1996 | Hong et al. | 365/185.01 |
| 5,497,017 A | 3/1996 | Gonzales | 257/306 |
| 5,504,357 A | 4/1996 | Kim et al. | 257/306 |
| 5,508,219 A | 4/1996 | Bronner et al. | 438/152 |
| 5,508,542 A | 4/1996 | Geiss et al. | 257/301 |
| 5,528,062 A | 6/1996 | Hsieh et al. | 257/298 |
| 5,593,912 A | 1/1997 | Rajeevakumar | 438/696 |
| 5,616,934 A | 4/1997 | Dennison et al. | 257/67 |
| 5,640,342 A | 6/1997 | Gonzalez | 365/156 |
| 5,644,540 A | 7/1997 | Manning | 365/200 |
| 5,646,900 A | 7/1997 | Tsukude et al. | 365/205 |
| 5,691,230 A | 11/1997 | Forbes | 438/412 |
| 5,710,057 A | 1/1998 | Kenney | 437/62 |
| 6,027,960 A * | 2/2000 | Kusumoto et al. | 438/166 |
| 6,093,623 A | 7/2000 | Forbes | 438/455 |

OTHER PUBLICATIONS

Adler, E., et al., "The Evolution of IBM CMOS DRAM Technology", 167–188, (Jan./Mar., 1995).

Asai, S., et al., "Technology Challenges for Integration Near and Below 0.1 micrometer", *Proceedings of the IEEE*, 85(4), Special Issue on Nanometer–Scale Science & Technology, 505–520, (Apr. 1997).

Banerjee, S.K., et al., "Characterization of Trench Transistors for 3–D Memories", *1986 Symposium on VLSI Technology, Digest of Technical Papers*, San Diego, CA, 79–80, (May 1986).

Blalock, T.N., et al., "A High–Speed Sensing Scheme for 1T Dynamic RAM's Utilizing the Clamped Bit–Line Sense Amplifier", *IEEE Journal of Solid–State Circuits*, 27(4), pp. 618–624, (Apr. 1992).

Bomchil, G., et al., "Porous Silicon: The Material and its Applications in Silicon–On–Insulator Technologies", *Applied Surface Science*, 41/42, 604–613, (1989).

Burnett, D., et al., "Implications of Fundamental Threshold Voltage Variations for High–Density SRAM and Logic Circuits", *1994 Symposium on VLSI Technology, Digest of Technical Papers*, Honolulu, HI, 15–16, (Jun. 1994).

Burnett, D., et al., "Statistical Threshold–Voltage Variation and its Impact on Supply–Voltage Scaling", *Proceedings SPIE: Microelectronic Device and Multilevel Interconnection Technology*, 2636, 83–90, (1995).

Chen, M.J., et al., "Back–Gate Forward Bias Method ofr Low–Voltage CMOS Digital Cicuits", *IEEE Transactions on Electron Devices*, 43, 904–909, (Jun. 1996).

Chen, M.J., et al., "Optimizing the Match in Weakly Inverted MOSFET's by Gated Lateral Bipolar Action", *IEEE Transactions on Electron Devices*, 43, 766–773, (May 1996).

Chesler, R., et al., "Solid–State Ionic Lasers", *In: Laser Handbook*, vol. 1, Arecchi, F.T., et al., (eds.), North–Holland Publishing Company, Amsterdam, P. 353, (1972).

Chung, I.Y., et al., "A New SOI Inverter for Low Power Applications", *Proceedings of the 1996 International SOI Conference*, Sanibel Island, FL, 20–21, (1996).

De, V.K., et al., "Random MOSFET Parameter Fluctuation Limits to Gigascale Integration (GSI)", *1996 Symposium on VLSI Technology, Digest of Technical Papers*, Honolulu, HI, 198–199, (Jun. 11–13, 1996).

Denton, J.P., et al., "Fully Depleted Dual–Gated Thin–Film SOI P–MOSFET's Fabricated in SOI Islands with an Isolated Buried Polysilicon Backgate", *IEEE Electron Device Letters*, 17(11), 509–511, (Nov.1996).

Fong, Y., et al., "Oxides Grown on Textured Single–Crystal Silicon—Dependence on Process and Application in EEPROMs", *IEEE Transactions on Electron Devices*, 37(3), pp. 583–590, (Mar. 1990).

Forbes, L., et al., "Resonant Forward–Biased Guard–Ring Diodes for Suppression of Substrate Noise in Mixed–Mode CMOS Circuits", *Electronics Letters*, 31, 720–721, (Apr. 1995).

Foster, R., et al., "High Rate Low–Temperature Selective Tungsten", *In: Tungsten and Other Refractory Metals for VLSI Applications III*, V.A. Wells, ed., Materials Res. Soc., Pittsburgh, PA, 69–72, (1988).

Fuse, T., et al., "A 0.5V 200MHz 1–Stage 32b ALU Using a Body Bias Controlled SOI Pass–Gate Logic", *1997 IEEE International Solid–State Circuits Conference, Digest of Technical Papers*, 286–287, (1997).

Gagliano, F.P., et al., "Laser Processing Fundamentals", *In Lasers in Industry*, edited by S.S. Charschan, Van Nostrand Reinhold Company, 156–164, (1972).

Gong, S., et al., "Techniques for Reducing Switching Noise in High Speed Digital Systems", *Proceedings of the 8th Annual IEEE International ASIC Conference and Exhibit*, Austin, TX, 21–24, (1995).

Gosele, U., et al., "Self–propagating Room–temperature Silicon Wafer Bonding in Ultrahigh Vacuum", *Applied Physics Letter*, 67(24), 3614–3616, (Dec. 11, 1995).

Hao, M.Y., et al., "Electrical Characteristics of Oxynitrides Grown on Textured Single–Crystal Silicon", *Appl. Phys. Lett.*, 60, 445–447, (Jan. 1992).

Harada, M., et al., "Suppression of Threshold Voltage Variation in MTCMOS/SIMOX Circuit Operating Below 0.5 V", *1996 Symposium on VLSI Technology, Digest of Technical Papers*, Honolulu, HI, 96–97, (Jun. 11–13, 1996).

Heavens, O., *Optical Properties of Thin Solid Films*, Dover Pubs. Inc., New York, 155–206, (1965).

Hisamoto, D., et al., "A New Stacked Cell Structure for Giga–Bit DRAMs using Vertical Ultra–Thin SOI (DELTA) MOSFETs", *1991 IEEE International Electron Devices Meeting, Technical Digest*, Washington, D.C., 959–961, (Dec. 8–11, 1991).

Hodges, D.A., et al., "MOS Decoders", *In: Analysis and Design of Digital Integrated Circuits, 2nd Edition*, Section: 9.1.3, 354–357, (1988).

Holman, W.T., et al., "A Compact Low Noise Operational Amplifier for a 1.2 Micrometer Digital CMOS Technology", *IEEE Journal of Solid–State Circuti*, 30, 710–714, (Jun. 1995).

Huang, W.L., et al., "TFSOI Complementary BiCMOS Technology for Low Power Applications", *IEEE Transactions on Electron Devices*, 42, 506–512, (Mar. 1995).

Jun, Y.K., et al., "The Fabrication and Electrical Properties of Modulated Stacked Capacitor for Advanced DRAM Applications", *IEEE Electron Device Letters*, 13, 430–432, (Aug. 1992).

Jung, T.S., et al., "A 117–mm2 3.3–V Only 128–Mb Multilevel NAND Flash Memory for Mass Storage Applications", *IEEE Journal of Solid–State Circuits*, 31, 1575–1582, (Nov. 1996).

Kang, H.K., et al., "Highly Manufacturable Process Technology for Reliable 256 Mbit and 1Gbit DRAMs", *IEEE International Electron Devices Meeting, Technical Digest*, San Francisco, CA, 635–638, (Dec. 11–14, 1994).

Kim, Y.S., et al., "A Study on Pyrolysis DMEAA for Selective Deposition of Aluminum", *In: Advanced Metallization and Interconnect Systems for ULSI Applications in 1995*, R.C. Ellwanger, et al., (eds.), Materials Research Society, Pittsburgh, PA, 675–680, (1996).

Kishimoto, T., et al., "Well Structure by High–Energy Boron Implantation for Soft–Error Reduction in Dynamic Random Access Memories (DRAMs)", *Japanese Journal of Applied Physics*, 34, 6899–6902, (Dec. 1995).

Kohyama, Y., et al., "Buried Bit–Line Cell for 64MB DRAMs", *1990 Symposium on VLSI Technology, Digest of Technical Papers*, Honolulu, HI, 17–18, (Jun. 4–7, 1990).

Koshida, N., et al., "Efficient Visible Photoluminescence from Porous Silicon", *Japanese Journal of Applied Physics*, 30, L1221–L1223, (Jul. 1991).

Kuge, S., et al., "SOI–DRAM Circuit Technologies for Low Power High Speed Multigiga Scale Memories", *IEEE Journal of Solid–State Circuits*, 31(4), pp. 586–591, (Apr. 1996).

Lantz, II, L., "Soft Errors Induced By Alpha Particles", *IEEE Transactions on Reliability*, 45, 174–179, (Jun. 1996).

Lehmann, V., "The Physics of Macropore Formation in Low Doped n–Type Silicon", *Journal of the Electrochemical Society*, 140(10), 2836–2843, (Oct. 1993).

Lu, N., et al., "The SPT Cell—A New Substrate–Plate Trench Cell for DRAMs", *1985 IEEE International Electron Devices Meeting, Technical Digest*, Washington, D.C., 771–772, (Dec. 1–4, 1985).

MacSweeney, D., et al., "Modelling of Lateral Bipolar Devices in a CMOS Process", *IEEE Bipolar Circuits and Technology Meeting*, Minneapolis, MN, 27–30, (Sep. 1996).

Maeda, S., et al., "A Vertical Phi–Shape Transistor (VPhiT) Cell for 1 Gbit DRAM and Beyond", *1994 Symposium of VLSI Technology, Digest of Technical Papers*, Honolulu, HI, 133–134, (Jun. 7–9, 1994).

Maeda, S., et al., "Impact of a Vertical Phi–Shape Transistor (VPhiT) Cellf for 1 Gbit DRAM and Beyond", *IEEE Transactions on Electron Devices*, 42, 2117–2123, (Dec. 1995).

Masu, K., et al., "Multilevel Metallization Based on Al CVD", *1996 IEEE Symposium on VLSI Technology, Digest of Technical Papers*, Honolulu, HI, 44–45, (Jun. 11–13, 1996).

McCredie, B.D., et al., "Modeling, Measurement, and Simulation of Simultaneous Switching Noise", *IEEE Transactions on Components, Packaging, and Manufacturing Technology—Part B*, 19, 461–472, (Aug. 1996).

Nitayama, A., et al., "High Speed and Compact CMOS Circuits with Multipillar Surrounding Gate Transistors", *IEEE Transactions on Electron Devices*, 36, 2605–2606, (Nov. 1989).

Ohba, T., et al., "Evaluation on Selective Deposition of CVD W Films by Measurement of Surface Temperature", *In: Tungsten and Other Refractory Metals for VLSI Applications II*, Materials Research Society, Pittsburgh, PA, 59–66, (1987).

Ohba, T., et al., "Selective Chemical Vapor Deposition of Tungsten Using Silane and Polysilane Reductions", *In: Tungsten and Other Refractory Metals for VLSI Applications IV*, Materials Research Society, Pittsburgh, PA, 17–25, (1989).

Ohno, Y., et al., "Estimation of the Charge Collection for the Soft–Error Immunity by the 3D–Device Simulation and the Quantitative Investigation", *Simulation of Semiconductor Devices and Processes*, 6, 302–305, (Sep. 1995).

Oowaki, Y., et al., "New alpha–Particle Induced Soft Error Mechanism in a Three Dimensional Capacitor Cell", *IEICE Transactions on Electronics*, 78–C, 845–851, (Jul. 1995).

Oshida, S., et al., "Minority Carrier Collection in 256 M–bit DRAM Cell on Incidence of Alpha–Particle Analyzed by Three–Dimensional Device Simulation", *IEICE Transactions on Electronics*, 76–C, 1604–1610, (Nov. 1993).

Ozaki, T., et al., "A Surrounding Isolation–Merged Plate Electrode (SIMPLE) Cell with Checkered Layout for 256Mbit DRAMs and Beyond", *1991 IEEE International Electron Devices Meeting*, Washington, D.C., 469–472, (Dec. 8–11, 1991).

Parke, S.A., et al., "A High–Performance Lateral Bipolar Transistor Fabricated on SIMOX", *IEEE Electron Device Letters*, 14, 33–35, (Jan. 1993).

Pein, H., et al., "A 3–D Sidewall Flash EPROM Cell and Memory Array", *IEEE Transactions on Electron Devices*, 40, 2126–2127, (Nov. 1993).

Pein, H., et al., "Performance of the 3–D Pencil Flash EPROM Cell and Memory Array", *IEEE Transactions on Electron Devices*, 42, 1982–1991, (Nov., 1995).

Pein, H.B., et al., "Performance of the 3–D Sidewall Flash EPROM Cell", *IEEE International Electron Devices Meeting, Technical Digest*, 11–14, (1993).

Ramo, S., et al., *Fields and Waves in Communication Electronics, Third Edition*, John Wiley & Sons, Inc., pp. 428–433, (1994).

Rao, K.V., et al., "Trench Capacitor Design Issues in VLSI DRAM Cells", *1986 IEEE International Electron Devices Meeting, Technical Digest*, Los Angeles, CA, 140–143, (Dec. 7–10, 1986).

Richardson, W.F., et al., "A Trench Transistor Cross–Point DRAM Cell", *IEEE International Electron Devices Meeting*, Washington, D.C., 714–717, (Dec. 1–4, 1985).

Sagara, K., et al., "A 0.72 micro–meter2 Recessed STC (RSTC) Technology for 256Mbit DRAM using Quarter–Micron Phase–Shift Lithography", *1992 Symposium on VLSI Technology, Digest of Technical Papers*, Seattle, WA, 10–11, (Jun. 2–4, 1992).

Seevinck, E., et al., "Current–Mode Techniques for High–Speed VLSI Circuits with Application to Current Sense Amplifier for CMOS SRAM's", *IEEE Journal of Solid State Circuits*, 26(4), pp. 525–536, (Apr. 1991).

Senthinathan, R., et al., "Reference Plane Parasitics Modeling and Their Contribution to the Power and Ground Path "Effective" Inductance as Seen by the Output Drivers", *IEEE Transactions on Microwave Theory and Techniques*, 42, 1765–1773, (Sep. 1994).

Shah, A.H., et al., "A 4–Mbit DRAM with Trench–Transistor Cell", *IEEE Journal of Solid–State Circuits*, SC–21, 618–625, (Oct. 1986).

Shah, A.H., et al., "a 4Mb DRAM with Cross–Point Trench Transistor Cell", *1986 IEEE International Solid–State Circuits Conference, Digest of Technical Papers*, 268–269, (Feb. 21, 1986).

Sherony, M.J., et al., "Reduction of Threshold Voltage Sensitivity in SOI MOSFET's", *IEEE Electron Device Letters*, 16, 100–102, (Mar. 1995).

Shimomura, K., et al., "A 1V 46ns 16Mb SOI–DRAM with Body Control Technique", *1997 IEEE International Solid–State Circuits Conference, Digest of Technical Papers*, 68–69, (Feb. 6, 1997).

Stanisic, B.R., et al., "Addressing Noise Decoupling in Mixed–Signal IC's: Power Distribution Design and Cell Customization", *IEEE Journal of Solid–State Circuits*, 30, 321–326, (Mar. 1995).

Stellwag, T.B., et al., "A Vertically–Integrated GaAs Bipolar DRAM Cell", *IEEE Transactions on Electron Devices*, 38, 2704–2705, (Dec. 1991).

Su, D.K., et al., "Experimental Results and Modeling Techniques for Substrate Noise in Mixed–Signal Integrated Circuits", *IEEE Journal of Solid–State Circuits*, 28(4), 420–430, (Apr. 1993).

Suma, K., et al., "An SOI–DRAM with Wide Operating Voltage Range by CMOS/SIMOX Technology", *IEEE Journal of Solid–State Circuits*, 29(11), pp. 1323–1329, (Nov. 1994).

Sunouchi, K., et al., "A Surrounding Gate Transistor (SGT) Cell for 64/256Mbit DRAMs", *1989 IEEE International Electron Devices Meeting, Technical Digest*, Washington, D.C., 23–26, (Dec. 3–6, 1989).

Sunouchi, K., et al., "Process Integration for 64M DRAM Using and Asymmetrical Stacked Trench Capacitor (AST) Cell", *1990 IEEE International Electron Devices Meeting*, San Francisco, CA, 647–650, (Dec. 9–12, 1990).

Sze, S.M., *In: Physics of Semiconductor Devices, Second Edition*, John Wiley & Sons, New York, p. 42, (1981).

Takai, M., et al., "Direct Measurement and Improvement of Local Soft Error Susceptibility in Dynamic Random Memories", *Nuclear Instruments & Methods in Physics Research*, B–99, Proceedings of the 13th International Conference on the Application of Accelerators in Research and Industry, Denton, TX, 562–565, (Nov. 7–10, 1994).

Takato, H., et al., "High Performance CMOS Surrounding Gate Transistor (SGT) for Ultra High Density LSIs", *IEEE International Electron Devices Meeting, Technical Digest*, 222–225, (1988).

Takato, H., et al., "Impact of Surrounding Gate Transistor (SGT) for Ultra–High Density LSI's", *IEEE Transactions on Electron Devices*, 38, 573–578, (Mar. 1991).

Tanabe, N., et al., "A Ferroelectric Capacitor Over Bit–Line (F–COB) Cell for High Density Nonvolatile Perroelectric Memories", *1995 Symposium on VLSI Technology, Digest of Technical Papers*, Kyoto, Japan, 123–124, (Jun. 6–8, 1995).

Temmler, D., "Multilayer Vertical Stacked Capacitors (MVSTC) for 64Mbit and 256Mbit DRAMs", *1991 Symposium on VLSI Technology, Digest of Technical Papers*, Oiso, 13–14, (May 28–30, 1991).

Terauchi, M., et al., "A Surrounding Gate Transistor (SGT) Gain Cell for Ultra High Density DRAMs", *1993 Symposium on VLSI Technology, Digest of Technical Papers*, Kyoto, Japan, 21–22, (1993).

Tong, Q., et al., "Hydrophobic Silicon Wafer Bonding", *Applied Physics Letter* 64(5), 625–627, (Jan. 31, 1994).

Tsui, P.G., et al., "A Versatile Half–Micron Complementary BiCMOS Technology for Microprocessor–Based Smart Power Applications", *IEEE Transactions on Electron Devices*, 42, 564–570, (Mar. 1995).

Verdonckt–Vandebroek, S., et al., "High–Gain Lateral Bipolar Action in a MOSFET Structure", *IEEE Transactions on Electron Devices* 38, 2487–2496, (Nov. 1991).

Vittal, A., et al., "Clock Skew Optimization for Ground Bounce Control", *1996 IEEE/ACM International Conference on Computer–Aided Design, Digest of Technical Papers*, San Jose, CA, 395–399, (Nov. 10–14, 1996).

Wang, N., *Digest MOS Integrated Circuits*, Prentice Hall, Inc., Englewood Cliffs, NJ, pp. 328–333, (1989).

Wang, P.W., et al., "Excellent Emission Characteristics of Tunneling Oxides Formed Using Ultrathin Silicon Films for Flash Memory Devices", *Japanese Journal of Applied Physics*, 35, 3369–3373, (Jun. 1996).

Watanabe, H., et al., "A New Cylindrical Capacitor Using Hemispherical Grained Si (HSG–Si) for 256Mb DRAMs", *IEEE International Electron Devices Meeting, Technical Digest*, San Francisco, CA, 259–262, (Dec. 13–16, 1992).

Watanabe, H., et al., "A Novel Stacked Capacitor with Porous–Si Electrodes for High Density DRAMs", *1993 Symposium on VLSI Technology, Digest of Technical Papers*, Kyoto, Japan, 17–18, (1993).

Watanabe, H., et al., "An Advanced Fabrication Technology of Hemispherical Grained (HSG) Poly–Si for High Capacitance Storage Electrodes", *Extended Abstracts of the 1991 International Conference on Solid State Devices and Materials*, Yokohama, Japan, 478–480, (1991).

Watanabe, H., et al., "Device Application and Structure Observation for Hemispherical–Grained Si", *J. Appl. Phys.*, 71, 3538–3543, (Apr. 1992).

Watanabe, H., et al., "Hemispherical Grained Silicon (HSG–Si) Formation on In–Situ Phosphorous Doped Amorphous–Si Using the Seeding Method", *Extended Abstracts of the 1992 International Conference on Solid State Devices and Materials*, Tsukuba, Japan, 422–424, (1992).

Watanabe, S., et al., "A Novel Circuit Technology with Surrounding Gate Transistors (SGT's) for Ultra High Density DRAM's", *IEEE Journal of Solid–State Circuits*, 30, 960–971, (Sep. 1995).

Weldon, M.K., et al., "Physics and Chemistry of Silicon Wafer bonding Investigated by Infrared Absorption Spectroscopy", *Journal of Vacuum Sci. Technology*, B 14(4), c1996 American Vacuum Society, 3095–3106, (Jul./Aug. 1996).

Yamada, T., et al., "A New Cell Structure with a Spread Source/Drain (SSD) MOSFET and a Cylindrical Capacitor for 64–Mb DRAM's", *IEEE Transactions on Electron Devices*, 38, 2481–2486, (Nov. 1991).

Yamada, T., et al., "Spread Source/Drain (SSD) MOSFET Using Selective Silicon Growth for 64Mbit DRAMs", *1989 IEEE International Electron Devices Meeting, Technical Digest*, Washington, D.C., 35–38, (Dec. 3–6, 1989).

Yeh, C., et al., "The Advanced Improvement of PN Mesa Junction Diode Prepared by Silicon–Wafer Direct Bonding", *Proceedings of Technical Papers, 1991 IEEE International Symposium on VLSI Technology, Systems, and Applications*, 136–140, (May 22–24, 1991).

"Proceedings of the 1st, 2nd, and 3rd International Symposia on Semiconductor Wafer Bonding: Science, Technology and Applications", *The Electrochemical Society Proceedings Series*, Electrochemical Society, Pennington, NJ (1992 Issue), 48–62,92–100,146–152, (1992–1995).

Abe, et al., "Silicon Wafer–Bonding Process Technology for SOI Structures", *Conference on Solid State Devices and Materials*, Sponsored by The Japan Society of Applied Physics, 853–856, (1990).

Auberton–Herve, A.J., "SOI: Materials to Systems", *Digest of the International Electron Device Meeting*, San Francisco, 5–10, (Dec. 1996).

Cartagena, et al., "Bonded Etchback Silicon on Sapphire Bipolar Junction Transistors", *In: The Electrochemical Society Interface*, 2(1) 1064–8208, Program and Abstracts: 183rd Meeting of the Electrochemical Society Pennington, NJ, 65–314. (1993).

Harendt, et al., "Silicon on Insulator Material by Wafer Bonding", *Journal of Electronic Materials*, 20(3), 267–77, (Mar. 1991).

Imthurn, et al., "Bonded Silicon–on–Sapphire Wafers and Devices", *Journal of Applied Physics*, 72(6), 2526–7, (Sep. 1992).

Lasky, J.B., "Wafer Bonding for Silicon–on–Insulator Technologies", *Applied Physics Letters*, 48(1), 78–80, (Jan. 6, 1986).

Lee, et al., "Novel Pattern Transfer Process for Bonded SOI Giga–bit DRAMs", *IEEE International SOI Conference*, Piscataway, NJ, 114–115, (1996).

Lu, et al., "Bonding Silicon Wafers by Use of Electrostatic Fields Followed by Rapid Thermal Heating", *Materials Letters*, 4(11), 461–464, (Oct. 1986).

Mumola, et al., "Recent Advances in Thinning of Bonded SOI Wafers by Plasma Assisted Chemical Etching", *Proceedings of the Third International Symposium on Semiconductor Wafer Bonding: Physics and Applications*, Electrochem. Soc., Pennington, NJ, 28–32, (1995).

Nakamura, et al., "Giga–bit DRAM Cells with Low Capacitance and Low Resistance Bit–Lines on Buried MOSFET's and Capacitors by Using Bonded SOI", *Technical Digest—International Electron Devices Meeting (IEEE)*, Piscataway, NJ, 889–892, (1995).

* cited by examiner

LOW TEMPERATURE SILICON WAFER BOND PROCESS WITH BULK MATERIAL BOND STRENGTH

FIELD OF THE INVENTION

The present invention relates to a method for bonding semiconductor articles and to a semiconductor article comprising bonded semiconductor articles.

BACKGROUND OF THE INVENTION

An increasing complexity of circuitry fabricated on and within semiconductor wafers has required greater complexity in the vertical structure of semiconductor wafers. For instance, early bipolar semiconductor devices were comprised of only two layers, typically deposited by chemical vapor deposition (CVD). These layers included an epitaxial layer and, for silicon wafers, a silicon dioxide passivation layer. Early metal-oxide-semiconductor (MOS) devices had only one silicon dioxide layer.

In contrast, more contemporary devices are constructed by utilizing a variety of very large scale integrated circuits (VLSI). The VLSI circuits are used in a solid state architecture divisible into two components—an instruction processor that supervises the order and decoding of instructions to be executed by the circuit and a data processor which performs the operations prescribed by the instructions on data. This complex circuitry has required multiple levels of circuit interconnects positioned vertically, as well as horizontally, over several wafer layers. The layers are fabricated to perform functions such as conductors, semiconductors or insulators. The layers have been typically formed by deposition, such as chemical vapor deposition (CVD) or physical vapor deposition (PVD). The complex circuitry has been fashioned from the layers utilizing sophisticated photo masking techniques.

One type of layer arrangement which has use in fabricating semiconductor devices, such as VLSI circuits, is a silicon layer positioned on an insulator (SOI) layer. This arrangement has been made by converting a top layer of a silicon wafer with a heavy oxygen implant to form an oxide. An epitaxial layer is grown on top of the oxide.

The SOI arrangement has also been made by bonding silicon wafers to each other. Bonded wafers have been fabricated to a thickness of five microns, with a resistivity in a range of 6 to 8 ohm-cm. The SOI structure permits layers of a semiconductor to be stacked using at least one insulating layer, a layer that bonds the layers together, and conductive interconnects or vertical busses extending through the insulating layer that are made utilizing a polymeric material such as an adhesive.

The annealed, bonded silicon wafers have been used to fabricate devices such as p-I-n diodes, power devices and micro mechanical structures. The annealed, bonded wafers have also been used to replace epitaxy fabrication. The annealed, bonded wafers have a versatility of thickness range which was not present in epitaxy fabrication in structures such as SOI structures.

With silicon wafer bonding and annealing, two flat silicon wafers, which are particle-free, are contacted to each other and bond with each other, chemically and physically. The wafer contact and physical bonding occur at ambient room temperature. The physically bonded wafers are annealed at an elevated temperature in order to increase bond strength by imparting a chemical bond to the wafers.

Q.-Y. Tong et al., in an article entitled "Hydrophobic Silicon Wafer Bonding" in *Applied Phys. Lett.*, 64, No. 5, on Jan. 31, 1994, at pages 625 to 627, quantified the bond strength of wafers which had been bonded to each other at room temperature and annealed at an elevated temperature. Tong et al. showed that the bond strength increased by about two orders of magnitude from room temperature to 1100° C. Tong et al. studied both hydrophilic wafers and hydrophobic wafers and concluded that bonded hydrophobic wafers displayed superior performance, despite hydrogen bubble generation at the interface of the two bonded wafers. Tong et al. found that the bond energy at the wafer interface approached the fracture energy of bulk silicon at 700° C. and higher temperatures.

Gosele et al. in an article, "Self-Propagating Room Temperature Silicon Wafer Bonding in Ultrahigh Vacuum," in *Appl. Phys. Lett.* in volume 67, No. 24, of Dec. 11, 1995 at pages 3614 to 3616, described a technique for minimizing the hydrogen bubble generation. Gosele et al. studied wafer bonding under high vacuum conditions. Gosele et al. demonstrated that four inch diameter hydrophobic wafers that were separately annealed at 600° to 800° C. in a vacuum to drive off hydrogen from the silicon surfaces when bonded at room temperature in vacuum achieved a uniform bubble-free bonded surface with a bond interface energy of bulk silicon.

The M. K. Weldon reference, "Physics and Chemistry of Silicon Wafer Bonding Investigated by Infrared Absorption and Spectroscopy," *J. Vac. Sci. Technol. B*, 14(4), July/August 1996, pp. 3095–3105, described the surface phenomena of annealed silicon wafer surfaces. Wafers considered were hydrophilic wafers and hydrophobic wafers. Weldon et al. observed a shift in Si—H stretching frequency of bonded hydrophobic wafers due to van der Waals attraction. Hydrogen was driven off during annealing at high temperatures and Si—Si bonds were formed between the surfaces of the two annealed wafers.

Hydrophilic wafers had three to five monolayers of water and hydroxyl groups that terminated the silicon oxide layer formation at low temperature. With heating, the water groups dissociated, leading to the formation of additional silicon oxide. The hydroxyl groups subsequently disappeared resulting in the formation of Si—O—Si bridging linkages across the two surfaces of two wafers.

The fabrication technique of silicon wafer bonding and annealing has been confined to early stages of silicon wafer fabrication. In particular, the annealing is performed prior to any circuit or film fabrication. This limitation is necessary because of the high temperature required to anneal the wafers to each other. The annealing temperature range is high enough to damage or destroy elements or films of any integrated circuit that might be positioned on the wafers.

SUMMARY OF THE INVENTION

Embodiments of the present invention comprise a method for bonding one semiconductor surface to a second semiconductor surface. The method includes providing an article that has a semiconductor surface. The semiconductor surface of the article is contacted to a second semiconductor surface of a second article. The semiconductor surfaces are annealed with a pulsed energy source that imparts energy which is confined substantially to the semiconductor surfaces of each article and which is of such a short duration that only the semiconductor surfaces to be bonded are raised to the necessary annealing temperatures leaving opposite semiconductor surfaces at a temperature near the ambient temperature. The annealed surfaces are then contacted to each other and bonded to each other.

In another embodiment, the present invention also includes a semiconductor device comprised of two or more bonded semiconductor wafers. The bond of the semiconductor wafers is substantially free of defects. Any high temperature effects are confined to a region near the surfaces of the semiconductor wafers which have been annealed.

In one other embodiment, the present invention additionally includes a first silicon wafer and a second silicon wafer which is annealed and then bonded to the first silicon wafer. The second silicon wafer includes an element which is subject to change at the semiconductor annealing temperature. The element is kept free from any changes due to high temperature exposure as a result of the pulsed annealing method employed.

DETAILED DESCRIPTION OF PREFERRED EMBODIMENTS

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the invention.

For purposes of this specification, the terms, "chip", "wafer", and "substrate" include any structure having an exposed surface of semiconductor material with which to form integrated circuit (IC) structures. These terms are also used to refer to semiconductor structures during processing and may include other layers that have been fabricated thereupon. The terms include doped and undoped semiconductors, epitaxial semiconductor layers supported by a base semiconductor or insulator, as well as other semiconductor structures known in the art. The term "conductor" is understood to include semiconductors, and the term "insulator" is defined to include any material that is less electrically conductive than the materials referred to as "conductors." The following description is, therefore, not to be taken in a limiting sense.

Figure 1:
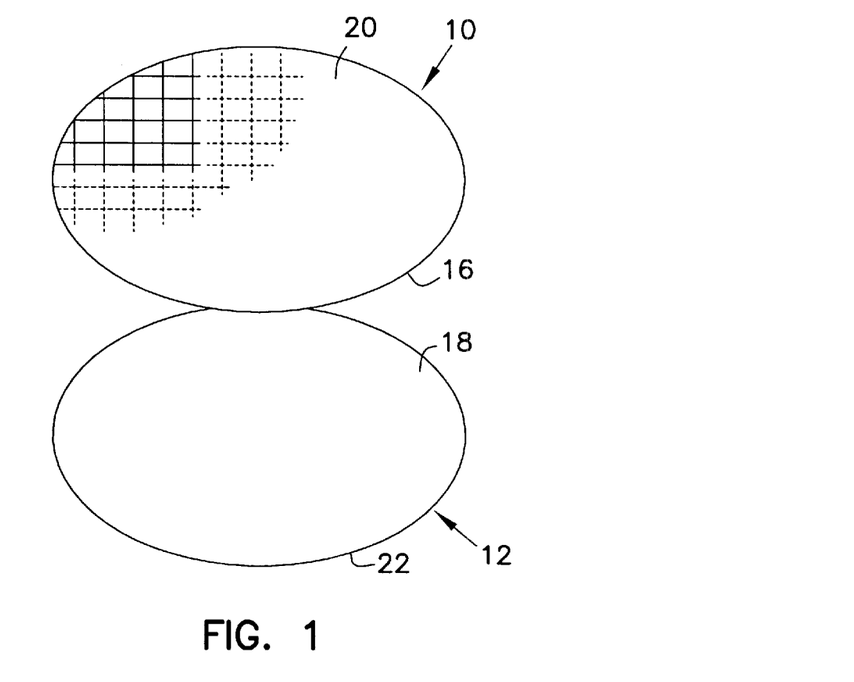
FIG. 1 is an exploded perspective view of two wafers that are annealed to make the semiconductor device of the present invention.
Figure 2:
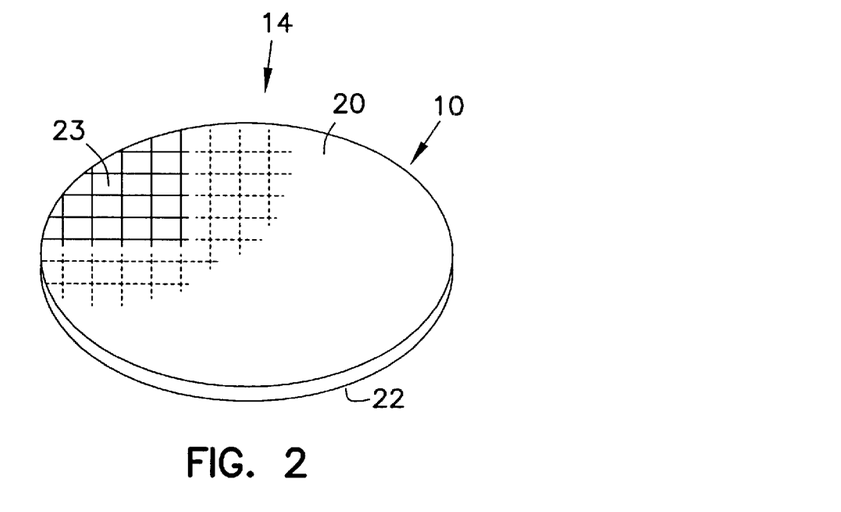
FIG. 2 is a perspective view of one embodiment of the semiconductor device of the present invention.
Figure 3:
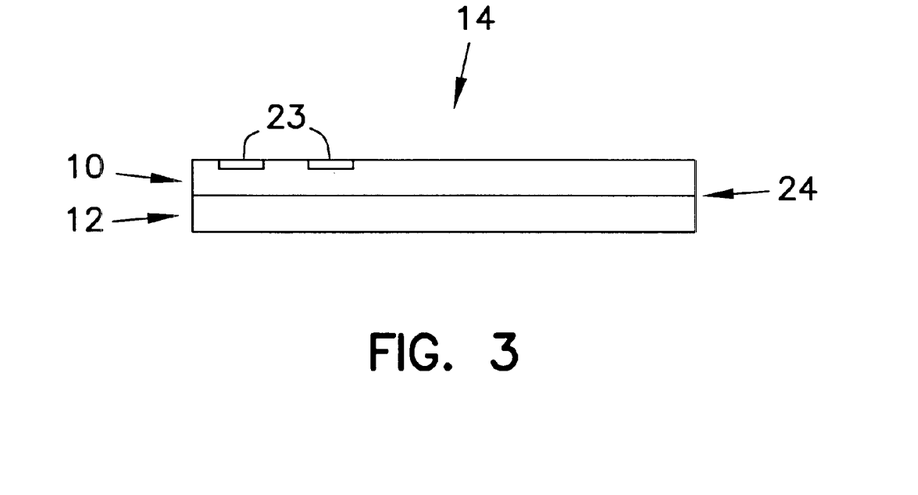
FIG. 3 is a cross-sectional view of one embodiment of the semiconductor device of the present invention.

The method of the present invention, for annealing and bonding one silicon wafer, such as is illustrated at 10 in FIG. 1 to another silicon wafer 12, to form a single bonded silicon wafer, illustrated in a perspective view at 14 in FIG. 2 and in cross-section in FIG. 3, includes providing two silicon wafers 10 and 12, and annealing designated annealing surfaces 16 and 18 of the wafers 10 and 12 with a high intensity, short duration laser pulse in a manner that heats the designated-annealing surfaces 16 and 18 to a temperature of at least about 500° C. within about 20 nanoseconds, while maintaining the remaining wafer mass and opposing non-annealed surfaces 20 and 22 at a temperature that is no greater than about 15 to 25° C. above room temperature. The annealed surfaces 16 and 18 are contacted and bonded to each other.

The present invention also includes a semiconductor device that comprises at least two silicon wafers 10 and 12, annealed and then bonded to each other, wherein at least one of the wafers has an integrated circuit such as is shown at 23 in FIGS. 2 and 3. The bond 24, formed by contacting surfaces of the two wafers 10 and 12 after the surfaces have been annealed, is substantially free of defects.

Figure 4:
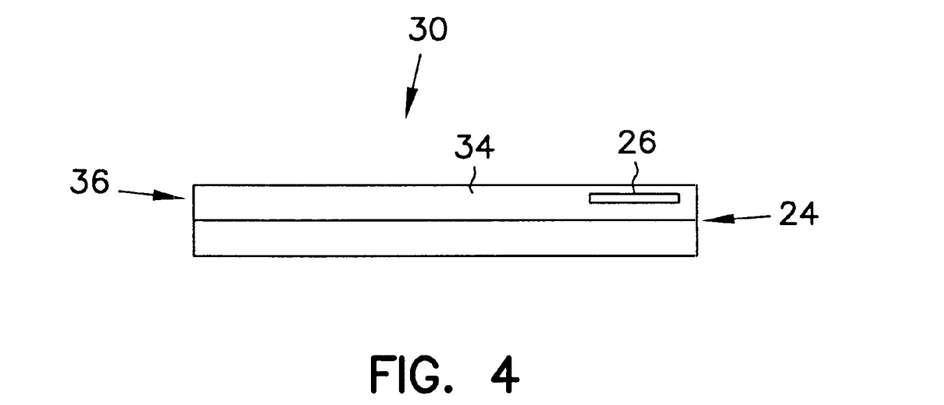
FIG. 4 is a cross-sectional view of one other embodiment of the semiconductor device of the present invention, the embodiment including an element changed at an annealing temperature of the semiconductor.

One embodiment of the semiconductor device, illustrated in cross-section at 30 in FIG. 4, further includes a layer or segment 26 produced by metallization, utilizing a metal such as aluminum, copper or other material such as polysilicon, that is positioned adjacent to silicon 34. In the embodiment, the aluminum or other metal is layered over or within a silicon wafer 36. The aluminum or other metal displays no high temperature effects even though the annealing bond temperature utilized in the method of the present invention would be expected to cause aluminum and silicon to dissolve into each other. The dissolution is expected because a eutectic point for aluminum or other metal and silicon occurs at 450° C.

While aluminum is described, it is believed that other materials that melt or change within a temperature range that corresponds to the annealing temperature of silicon do not melt or change when subjected to the wafer annealing method of the present invention. Other materials include copper, polysilicon, and gold.

The method of the present invention imparts to semiconductor device manufacture, a versatility not heretofore possible. With the method of the present invention, a semiconductor manufacturer can fabricate desired circuits on different wafers and then bond and anneal the wafers together without damaging or negatively impacting the circuits. As a consequence of the method of the present invention, circuit arrays may be mass produced on wafers and then combined with a variety of other, desired arrays on other wafers through the annealing and bonding process.

This versatility is a great improvement over the conventional semiconductor fabrication methods which require a manufacturer to either perform the wafer bonding prior to circuit fabrication or to risk the occurrence of undesirable changes in a circuit as a result of exposure by the circuit to the elevated temperature of bonding.

The silicon wafers provided in the method of the present invention are, in one embodiment, circular in shape with a diameter of about four inches. Wafers with other diameters or with other symmetries with other dimensions may also be suitable for use. Silicon constructions other than wafers are also suitable for use in the method of the present invention. It is also contemplated that semiconductor materials other than silicon may be usable in the method of the present invention, such as gallium arsenide or germanium.

The silicon wafers are dipped in a dilute hydrofluoric acid (HF) solution in order to remove any native silicon oxide from the wafer surfaces to be bonded. The surfaces are rendered hydrophobic by replacement of oxygen from the silicon oxide on the wafer surface with hydrogen from the HF.

Figure 8A:
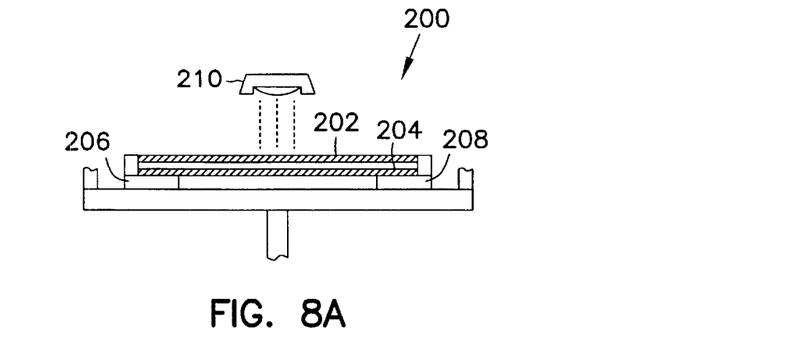
FIG. 8A is a side view of a device for bonding two semiconductor wafers to each other.
Figure 8B:
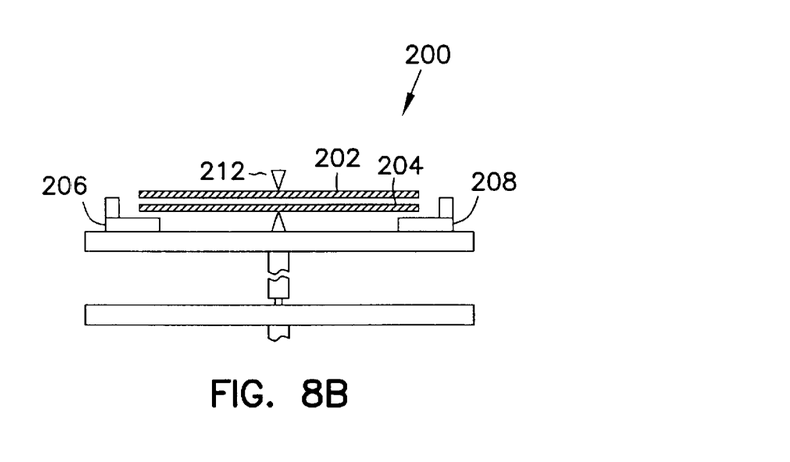
FIG. 8B is a side view of the device of FIG. 8A bonding the two semiconductor wafers to each other.

The wafers with hydrophobic surfaces are then, in one embodiment, initially bonded to each other at room temperature and atmospheric pressure. The bonding is performed by contacting the wafers to each other in an environment free of dust or other airborne particles or vapors. The bonding process, illustrated in one embodiment in FIGS. 8A and 8B, employs a spinner apparatus 200 and wafers 202 and 204 positioned on the spinner apparatus 200 by contacts 206 and 208. The wafers 202 and 204 are initially spun under a low intensity infrared lamp 210 at a temperature that is less than approximately 80° C. After spinning, the wafers 202 and 204 are contacted together and pinched by a pinching mechanism 212. This initial bonding is principally due to van der Waals forces.

Figure 9:
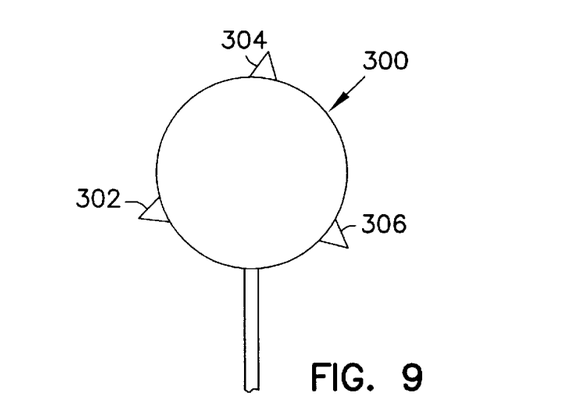
FIG. 9 is a top view of a device for separating bonded wafers.

The bonded wafers are then transferred to an ultra-high vacuum (UHV) chamber which is pumped down to about $3 \times 10^{-9}$ Torr. The bonded wafers are separated into two wafers by a separating mechanism such as is illustrated at 300 in FIG. 9. In one embodiment, the separating mechanism 300 includes three wedges 302, 304 and 306, positionable between the wafers at a rim of each wafer. The separated wafers are observable by a camera transmission from within the vacuum chamber.

In another embodiment, the wafers are stored in an ultra clean environment prior to introduction into the vacuum chamber. These wafers do not undergo an initial bonding step.

The purpose of the wafer bonding is to retain cleanliness of wafer surfaces that are to be annealed. If the cleanliness can be maintained without bonding, then it is not required that the wafers be initially bonded to each other.

Figure 5:
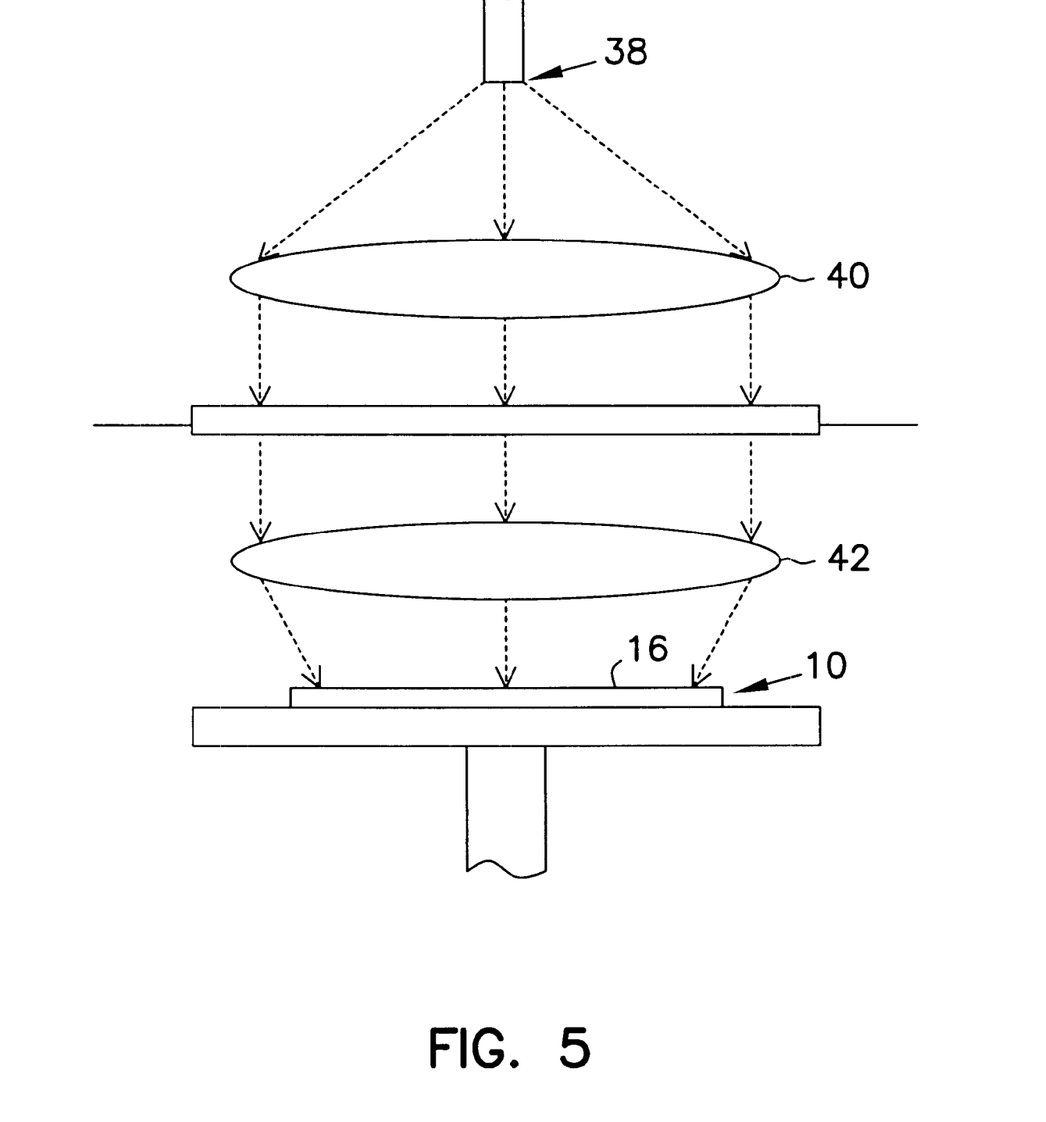
FIG. 5 is a perspective view of the semiconductor mounted for annealing by laser-treatment.

Once the wafers 10 and 12 are separated in the vacuum chamber, the wafer surfaces 16 and 18 that had been bonded to each other are exposed to energy from a laser pulse such as is illustrated for wafer surface 16 in FIG. 5. This exposure occurs in the vacuum chamber. Wafer surfaces 16 and 18 are sequentially exposed to energy from laser 38. The laser pulse sequentially elevates the temperature of the surfaces 16 and 18 to a temperature of about 800° C. At this temperature and energy level, hydrogen is driven from the hydrophobic wafer surfaces 16 and 18. The depth of the wafer thickness which is exposed to the laser energy and which is at a temperature of about 800° C. is no more than about 0.25 microns. Energy as manifested by an elevated temperature is substantially confined to the surface of the wafer.

A pulsed energy source such as a pulsed laser is preferred because a laser operating in a pulsed mode can instantaneously heat an area of a wafer without influencing the underlying substrate. In particular, heating with a pulsed laser causes substantially no mechanical damage to the wafer because the thermal relaxation time of the pulsed laser is negligibly small as compared to the reaction time of a mechanical stress such as thermal expansion.

The pulsed energy source should not be of a magnitude that is so high as to cause the silicon material or other semiconductor material to evaporate. The pulsed energy source must be of a magnitude to elevate the temperature to a range of 500 to 800° C.

In one embodiment of the method of the present invention, the annealing energy is generated by a q-switched ruby laser, producing a wavelength of 0.69 microns. The peak power required is about $10^8$ watts/cm$^2$. For a fully illuminated four inch wafer, this energy corresponds to an incident optical pulse energy of approximately 243 joules.

One other type of laser that may be used in the method of the present invention is a frequency doubled Neodymium doped Yittrium Aluminum Garnet (Nd/YAG) laser emitting 0.53 microns wavelength. A laser emitting light within the green spectrum, near the blue spectrum is suitable for use in the present invention. Because the absorption coefficient in silicon increases at shorter wavelengths, a decrease in the required pulse power and energy can be realized by choosing a shorter wavelength laser such as the ruby laser described, or the frequency doubled, Nd/YAG laser, described above.

It is contemplated that energy sources other than pulsed optical energy may be used in the method of the present invention. These other energy sources include pulsed ion beam, pulsed x-ray beam and others. These other energy sources have the similar pulse width and energy as is described for laser beam energy. This annealing energy and laser source is optimal for the hydrophobic wafer surface because under the process conditions, the optical properties of the silicon are such that absorption coupling to the incident radiation is appreciably greater than for example, silicon dioxide. As a consequence, wafer material opposing the laser-treated surfaces 16 or 18 remains relatively cool.

In one other method embodiment, it has been found that by illuminating only a fraction of the wafer, for example 10% of the surface area, at a given time, the required pulse energy of a laser such as a q-switched ruby laser can be reduced by a factor of ten. This operation is performed at the expense of stepping the annealing laser beam 10 to 20 times across the wafer surface. For a 48 mil thick, 4 inch wafer, the temperature rise of the surface opposite the surface illuminated with the full 243 joule pulse is about 15° C.

Figure 6:
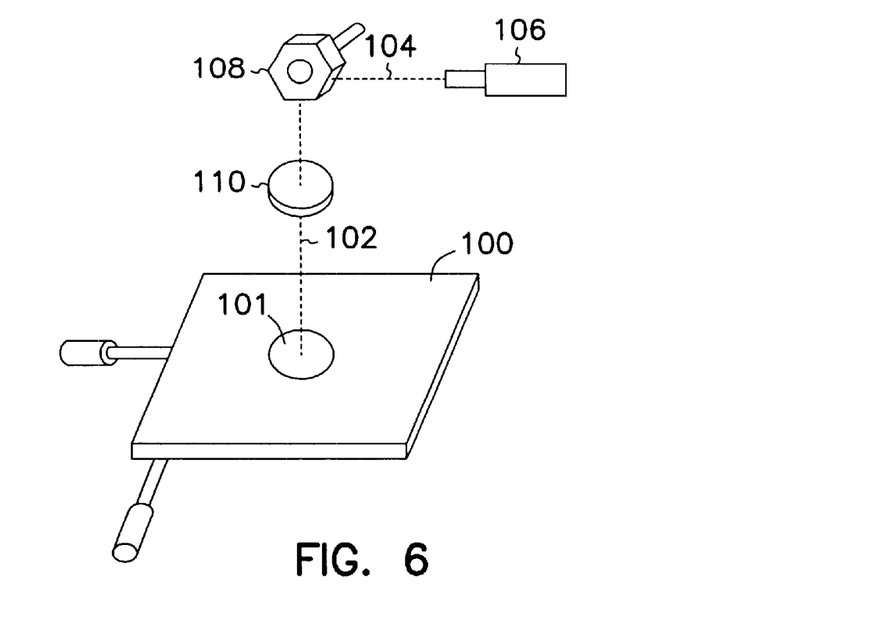
FIG. 6 is a perspective view of the semiconductor mounted for a laser raster scan.
Figure 7:
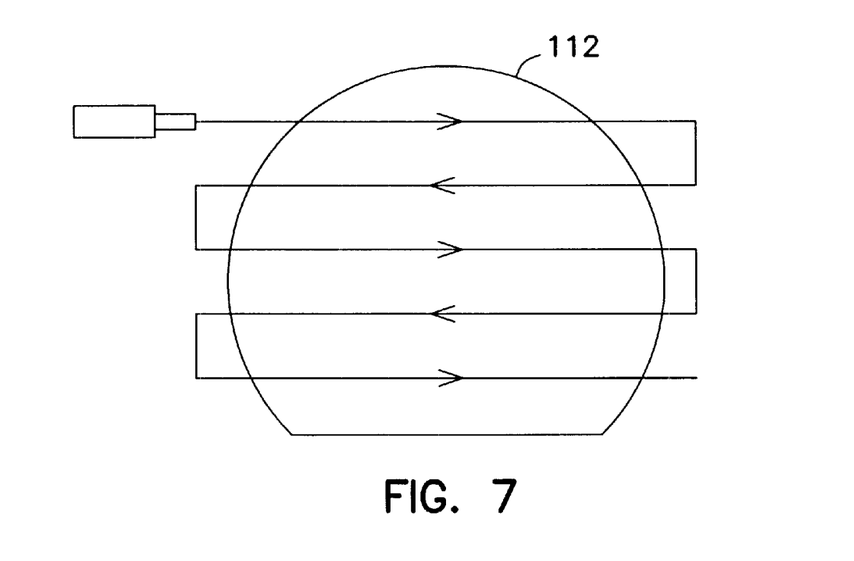
FIG. 7 is a top view of a laser raster scan.

This method embodiment of illuminating a fraction of a wafer surface area requires that the wafer surface area be capable of being scanned. The wafer 101 is mounted on a stage 100, such as is illustrated in FIG. 6 which is movable in an x-axis and a y-axis in relation to a fixed laser beam 102. With the embodiment shown in FIG. 6, a scanning system 104 is comprised of a laser 106, a multifaceted mirror 108 and focusing optics 110. The beam 102 from the laser 106 is directed toward the multifaceted mirror 108 which rotates clockwise. The beam 102 is reflected toward the wafer 101 through the focusing optics 110. The beam 102 impinges the surface of the wafer 101 and moves laterally across the wafer 101 as shown at 112 in FIG. 7. The mirror 108 rotates in concert with the movement of the wafer 101 which results in the wafer being raster scanned as is shown in FIG. 7. In another embodiment, the wafer 10 is fixed and the laser beam is collimated and reflected by x and y galvanometer-controlled mirrors. The laser beam is focused by lenses such as are shown at 40 and 42 in FIG. 5 to impinge in a raster x and y movement across the wafer 10.

By scanning the surface of the wafer, another efficiency improvement occurs. This improvement is an increase in the area and volume of the annealed and bonded wafer that is usable for circuit support. Conventionally bonded wafers have a disadvantage in that a silicon device layer covers the wafer to within three millimeters of the edge of the wafer substrate. The remaining wafer surfaces and wafer volume is unusable and is wasted. On a 100 millimeter square area wafer, this leads to a loss of approximately 10% of the silicon wafer. Scanning the surface of the wafer with a laser substantially eliminates this wastage.

An evolution of hydrogen gas resulting from driving hydrogen from the hydrophobic surfaces of the wafers increases pressure in the vacuum chamber to about $10^{-6}$ Torr. After the annealing step, the vacuum pressure in the vacuum chamber was decreased to approximately $3 \times 10^{-9}$ Torr. The vacuum is of a magnitude that removes debris from the silicon surface formed during the annealing step.

Laser annealed surfaces 16 and 18 are brought together and pressed in a manner wherein force is concentrated in the center of the wafers 10 and 12 to initiate a contact 26 which chemically bonds the wafers at 24. The contact produces a bonding wave over the designated annealing surface of the wafer. The interface 24 between the two wafers is bonded together by Si–Si bonds. The bond strength is typical of bulk silicon.

Process variables such as laser wavelength, laser output in joules, and vacuum magnitude are adjustable with experimentation in order to optimize the method of the present invention, by experimentation. In particular, wafers made under one set of identified process parameters are tested for bond strength and bond flaws. The tests are destructive tests. In one test, bonded wafers are pulled apart. In another test, bonded wafers are sectioned and are examined for flaws. Once optimal process variables are identified through fabrication and destructive testing, only a small percentage of the bonded wafers formed are checked for compliance.

Figure 10:
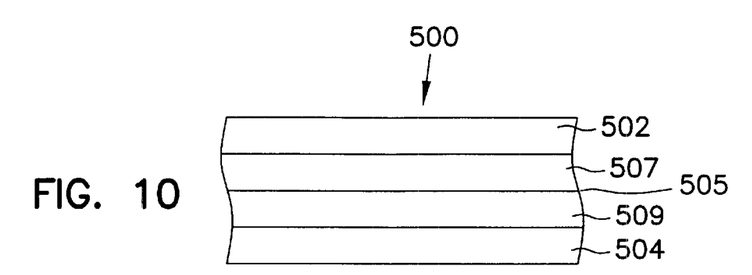
FIG. 10 is a cross-sectional view of bonded wafers with an epitaxial layer.
Figure 11A:
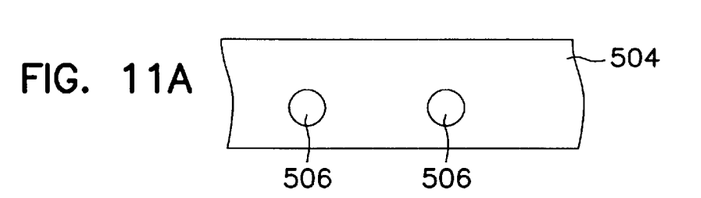
FIG. 11A is a cross-sectional view of a bonded wafer layer of FIG. 10 with an ion implant wherein the implant is positioned within the layer.
Figure 11B:
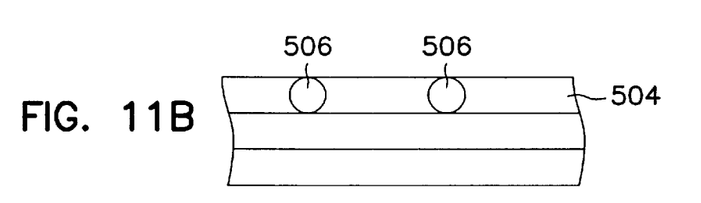
FIG. 11B is a cross-sectional view of a bonded wafer layer of FIG. 10 with an ion implant wherein the implant substantially traverses the layer.

The bonded wafers produced by the method of the present invention may be fabricated for silicon-on-insulator, SOI, processes. In one embodiment, illustrated in FIG. 10, a bonded wafer 500 is etched, preferentially, to pattern a thin epitaxial layer 502 above a bonded region 505. The epitaxial layer 502 may be used for fabrication of CMOS or high voltage devices. The bonded wafer 500 also includes silicon layers 507 and 509 adjacent to the bonded region 505. The bonded wafer 500 also includes an insulating oxide layer 504 adjacent to the silicon layer 509. In one embodiment, the insulating oxide layer 504 is formed in a silicon substrate by ion implantation 506, as is shown schematically for layer 504 in FIGS. 11A and 11B. Ion implants 506 in FIG. 11A are positioned within the layer 504 while ion implants 506 traverse the layer 504 in FIG. 11B.

The wafer bonding process may be used to produce silicon wafers bonded to germanium to form sensors or fiber optic elements to electronic circuit interfaces. Silicon based circuits may also be integrated with gallium arsenide based circuits or lasers. With this bonding, the non-silicon wafer may be coated with a diffusion barrier such as silicon dioxide or a ceramic or tungsten. Once oxide is stripped from the silicon wafer, the wafer surface is annealed with a laser. The two wafers are clamped together to create a bond. This bonding process embodiment may be used to make a device such as a microminiature, electric-to-fluidic valve.

The method of the present invention produces bonded wafers that are free from an oxide layer formed at the junction of the wafers. The benefit of this bonded wafer product is that it can be used in the manufacture of a device with a NMOS transistor and a PMOS transistor with minimal risk of "latch-up."

Figure 12:
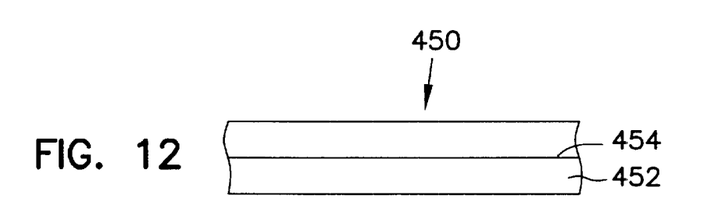
FIG. 12 is a cross-sectional view of a bonded wafer with a P-N junction.

The localized annealing of the method of the present invention permits fabrication of devices with elements that are susceptible to damage at elevated temperatures because the elevated temperatures are restricted to the wafer surfaces. The wafer bonding process of the present invention may be used to bond a p type wafer such as is shown at 450 in FIG. 12, with an n type wafer 452 to form a P-N junction 454. A deep P-N junction can be provided by selecting wafers having substantially the same crystallographic orientation and opposite conductivity types of desired dopant concentrations. The orientations of the two wafers are aligned within approximately one degree.

Figure 13:
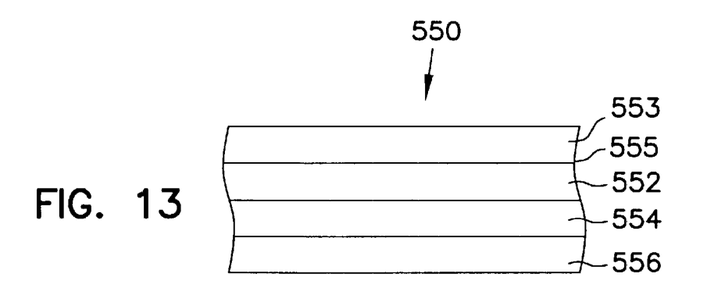
FIG. 13 is a cross-sectional view of a bonded wafer that comprises several layers.

One other type of SOI device illustrated at 550 in FIG. 13 that can be prepared with the method of the present invention includes several layers 554 and 556 below a top silicon layer 552. These layers 554 and 556 may include silicon nitride, diamond, polycrystalline silicon, a metallic interlayer and others. The top silicon layer 552 is bonded to a silicon wafer 553 at 555.

The bonded wafers may be used to fabricate a single chip with multiple devices integrated within the chip. The bonded wafers permit improved device design for devices such as surface emitting lasers and light emitting diodes. These devices and device features include insulators hardened by radiation for increased radiation tolerance in military and space IC applications.

Although the present invention has been described with reference to preferred embodiments, workers skilled in the art will recognize that changes may be made in form and detail without departing from the spirit and scope of the invention.

What is claimed is:

1. A method for bonding one semiconductor surface to a second semiconductor surface, comprising:
    providing an article that has a semiconductor surface;
    providing a second article that has a semiconductor surface;
    annealing the semiconductor surfaces in a state of separation under a vacuum with an energy source wherein energy from the energy source is substantially confined to the semiconductor surfaces; and
    contacting the semiconductor surface of the article to the second semiconductor surface of the second article to form a bond after annealing, while in a vacuum.

2. The method of claim 1 and further including fabricating an integrated circuit on or within a surface of the article which opposes the surface which is annealed.

3. The method of claim 2 wherein fabricating the integrated circuit is performed prior to annealing the semiconductor surfaces.

4. The method of claim 3 wherein the semiconductor surfaces are annealed at a temperature of at least about 600° Centigrade while the integrated circuit temperature is within 15 to 25° Centigrade of room temperature.

5. The method of claim 1 wherein the semiconductor surfaces are annealed with at least one laser pulse.

6. The method of claim 5 wherein the laser pulse is an incident optical pulse energy of approximately 243 joules, applied over the surface having a diameter of four inches.

7. The method of claim 5 wherein the laser pulse is generated by a q-switched ruby laser.

8. The method of claim 1 wherein annealing comprises exposing the energy source to the semiconductor surface incrementally over the semiconductor surface.

9. The method of claim 1 wherein annealing comprises exposing the energy source to the entire semiconductor surface in a single exposure.

10. The method of claim 1 and further including stripping any native oxide from at least one of the semiconductor surfaces prior to annealing.

11. The method of claim 1 wherein the articles are subjected to a temporary bonding prior to annealing.

12. The method of claim 11 wherein the articles are stored in an ultra clean environment prior to being subjected to a vacuum.

13. The method of claim 1 and further including treating at least one of the semiconductor surfaces to render the surface hydrophobic prior to annealing.

14. The method of claim 13 and further including temporarily bonding the treated surfaces to each other prior to annealing the surfaces.

15. The method of claim 14 wherein the bonded treated surfaces are subjected to an ultra-high vacuum.

16. The method of claim 15 and further including separating the surfaces prior to annealing, under a vacuum.

17. The method of claim 16 wherein the vacuum is approximately $3 \times 10^{-9}$ Torr.

18. A method for bonding one semiconductor wafer to another semiconductor wafer in order to maximize area and volume of a bonded wafer, comprising:

providing first and second semiconductor wafers;

annealing surfaces of the semiconductor wafers in a state of separation under vacuum with an energy source wherein energy from the energy source is substantially confined to the semiconductor surfaces and energy is sequentially applied to a fraction of each of the surfaces; and bonding the annealed surfaces to each other, while under vacuum.

19. The method of claim 18 wherein the energy source is pulsed.

20. The method of claim 18 wherein the energy is sequentially applied so that a sum of the fractions comprises substantially an entire surface of the wafer.

21. The method of claim 18 wherein the energy is applied as a fraction of energy to a fraction of the wafer surface, as is applied to an entire wafer surface.

22. The method of claim 18 wherein each fraction to which energy is applied is approximately one-tenth of the surface of the wafer.

23. The method of claim 18 and further including mounting the silicon wafers on a stage.

24. The method of claim 23 wherein the stage is moveable in an x-axis and a y-axis in relation to a fixed energy source.

25. The method of claim 23 wherein the stage is fixed and the energy source is moveable.

26. The method of claim 23 and further including focusing energy from the energy source to impinge in a raster x and y movement across the wafer surface.

* * * * *